(12) United States Patent
O'Sullivan et al.

(10) Patent No.: US 6,557,626 B1
(45) Date of Patent: May 6, 2003

(54) HEAT SINK RETAINER AND HEAT SINK ASSEMBLY USING SAME

(75) Inventors: Michael O'Sullivan, Willowbrook, IL (US); Kent E. Regnier, Lombard, IL (US); Blaine C. Woting, Derry, NH (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/481,214

(22) Filed: Jan. 11, 2000

(51) Int. Cl.[7] ................................................. H05K 7/20
(52) U.S. Cl. ........................ 165/121; 165/80.3; 361/697
(58) Field of Search ................................. 165/80.3, 185, 165/121; 361/704, 697

(56) References Cited

U.S. PATENT DOCUMENTS

| | | | |
|---|---|---|---|
| 2,161,417 A | 6/1939 | Holmes ........................ 122/13 |
| 2,396,216 A | 3/1946 | Vang ............................ 219/10 |
| 2,413,179 A | 12/1946 | Grandmont et al. ........ 257/263 |
| 3,152,217 A | 10/1964 | Balchaitis ..................... 174/35 |
| 3,185,756 A | 5/1965 | Allison ......................... 174/35 |
| 3,187,082 A | 6/1965 | Allison ......................... 174/35 |
| 3,213,336 A | 10/1965 | McAdam ..................... 317/234 |
| 3,239,003 A | 3/1966 | Boudette et al. ............ 165/185 |
| 3,280,907 A | 10/1966 | Hoffman ...................... 165/185 |
| 3,372,733 A | 3/1968 | Callender ...................... 165/1 |
| 3,566,958 A | 3/1971 | Zelina .......................... 165/80 |
| 4,607,685 A | 8/1986 | Mitchell, Jr. ................ 165/80.3 |
| 4,682,651 A | 7/1987 | Gabuzda ..................... 165/80.3 |
| 4,715,438 A | 12/1987 | Gabuzda et al. ............ 165/185 |
| 4,716,494 A | 12/1987 | Bright et al. ................ 361/386 |
| 4,733,293 A | 3/1988 | Gabuzda ........................ 357/81 |
| 4,753,290 A | 6/1988 | Gabuzda ..................... 165/185 |
| 5,132,780 A | * 7/1992 | Higgins, III .................. 357/81 |
| 5,561,338 A | * 10/1996 | Roberts et al. ................ 313/46 |
| 5,597,034 A | 1/1997 | Barker, III et al. ......... 165/80.3 |
| RE35,573 E | 7/1997 | Clemens ...................... 257/719 |
| 5,782,292 A | 7/1998 | Ogawara et al. ........... 165/80.3 |
| 5,785,116 A | 7/1998 | Wagner ...................... 165/80.3 |
| 5,794,685 A | 8/1998 | Dean ........................... 165/121 |
| 5,828,551 A | 10/1998 | Hoshino et al. ............. 361/697 |
| 5,910,694 A | 6/1999 | Yokozawa et al. ............ 310/89 |
| 5,927,385 A | 7/1999 | Yeh ............................. 165/80.3 |

FOREIGN PATENT DOCUMENTS

| | | |
|---|---|---|
| DE | 44339 | 1/1908 |
| DE | 1188208 | 3/1965 |
| JP | 8-8493 | 1/1996 |
| JP | 8-264693 | 10/1996 |

* cited by examiner

*Primary Examiner*—Allen Flanigan
(74) *Attorney, Agent, or Firm*—Robert J. Zeitler (57) ABSTRACT

A heat sink assembly includes a heat exchanging section having a thermally conductive sheet folded into alternating ridges and troughs defining spaced fins having first and second end edges. The folded sheet is formed into a generally cylindrical configuration defining an axis. The troughs form an inner segmented cylinder, the ridges form an outer segmented cylinder generally concentric with the inner cylinder and the fins radiate generally outwardly from the axis. A thermally conductive core is provided within the inner segmented cylinder defined by the troughs of the cylindrically folded sheet to transfer the heat to be dissipated from the heat generating component to the heat exchanging section. A retainer is engageable with the cylindrically folded sheet generally at the second end edges of the fins. The heat exchanging section may be mounted above a base plate, with the first end edges of the fins being between the base plate and the second end edges of the fins and complementary interengaging latches are provided between the retainer and the base plate to hold the heat exchanging section therebetween.

23 Claims, 7 Drawing Sheets

HEAT SINK RETAINER AND HEAT SINK ASSEMBLY USING SAME

FIELD OF THE INVENTION

This invention generally relates to cooling devices such as heat exchangers and, particularly, to a heat sink retainer and a heat sink assembly using the heat sink retainer to dissipate heat from heat generating components.

BACKGROUND OF THE INVENTION

In various industries, such as in the computer industry, there is a need for low cost high performance heat exchangers to cool such components as microprocessors or semiconductors. Many semiconductors create so much heat that they can be irreparably damaged if the heat is not removed. Consequently, heat exchangers employing heat sinks have been used to pull the heat away from the semiconductor and disperse that heat into the atmosphere. However, prior art heat sinks have generally been configured in such a manner that the air flow is either unidirectional or bidirectional, thereby making them susceptible to recirculating the heated air on or near the component(s) to be cooled. The present invention is directed to improvements in such heat sink retainers and heat sink assemblies.

SUMMARY OF THE INVENTION

An object, therefore, of the invention is to provide a new and improved heat sink retainer and heat sink assembly of the character described.

In one embodiment of the invention, the heat sink assembly used to dissipate heat from a heat generating component includes a heat exchanging section having a thermally conductive sheet folded into alternating ridges and troughs defining spaced fins having first and second end edges. The folded sheet is formed into a generally cylindrical configuration defining an axis. The troughs form an inner segmented cylinder, the ridges form an outer segmented cylinder generally concentric with the inner cylinder and the fins radiate outwardly from the axis, thereby allowing air to be circulated in all directions and not just the unidirectional or bidirectional pattern common in prior art heat exchangers. A thermally conductive core is provided within the inner segmented cylinder defined by the troughs of the cylindrically folded sheet to transfer the heat to be dissipated from the heat generating component to the heat exchanging section. A retainer is engaged with the cylindrically folded sheet generally at the second end edges of the fins to retain the cylindrically folded sheet about the periphery of the core.

As disclosed herein, the retainer includes a circular top portion for engaging the cylindrically folded sheet at the second end edges of the fins. A plurality of fingers depend from a peripheral edge of the circular top portion and are individually engageable with at least some of the ridges of the cylindrically folded sheet. At least some of the ridges include apertures that serve the dual purpose of allowing additional air flow through the fins and for receiving latch detents on the insides of respective ones of the fingers. At least one stop projection extends from the top portion between an adjacent pair of the fins of the cylindrically folded sheet to prevent rotation of the retainer relative to the heat exchanger.

The invention contemplates that the assembly may include a base plate above which the heat exchanging section is mounted. The first end edges of the fins of the cylindrically folded sheet are disposed between the base plate and the second end edges of the fins. Additionally, a peripheral shoulder on the core may be employed to raise the heat exchanging section off of the base plate so that the first end edges of the fins of the cylindrically folded sheet are spaced from the base plate. Complementary interengaging latch means are provided between the retainer and the base plate to hold the heat exchanging section therebetween.

The complementary interengaging latch means includes a latch arm depending from the retainer on the outside of the cylindrically folded sheet. A latch flange projects upwardly from the base plate. A resilient latch hook on one of the latch arm or latch flange snappingly engages in a latch opening in the other of the latch arm or latch flange.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
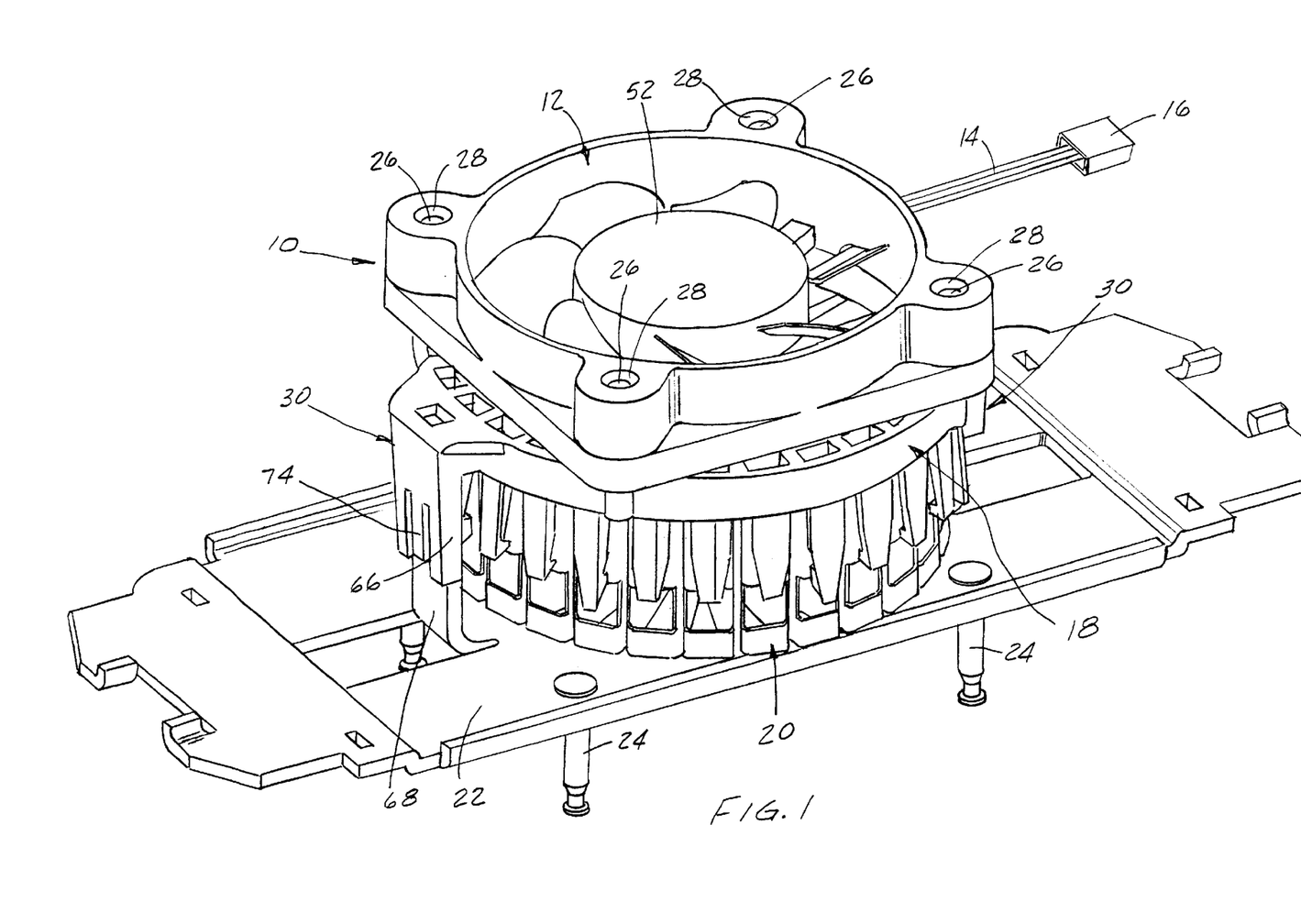
FIG. 1 is a top perspective view of a heat exchanger assembly incorporating the heat sink assembly and retainer means of the invention.
Figure 2:
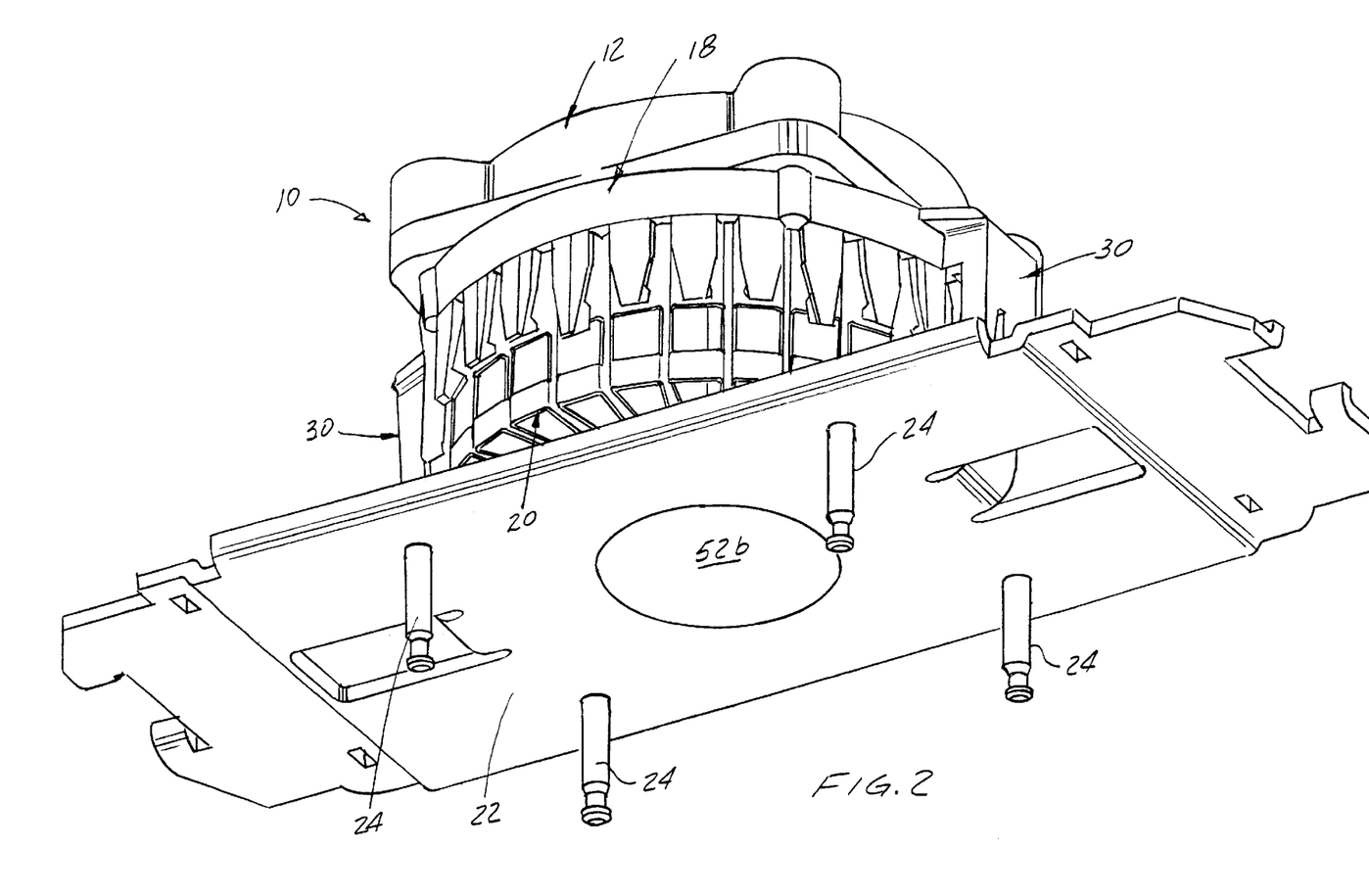
FIG. 2 is a bottom perspective view of the assembly of FIG. 1.

Referring to the drawings in greater detail, and first to FIGS. 1 and 2, the invention is incorporated in a heat exchanger assembly, generally designated 10, which includes a circular fan assembly, generally designated 12, having lead wires 14 extending therefrom and terminating in an electrical connector 16. Assembly 10 may also be called a heat sink assembly. The fan assembly is mounted on top of a retainer, generally designated 18, which, in turn, is mounted on top of a heat exchanging section, generally designated 20. The heat exchanging section, in turn, is mounted above a plate 22. The base plate has a plurality of mounting posts 24 for mounting heat exchanger assembly 10 on or near a heat generating component (not shown).

Figure 3:
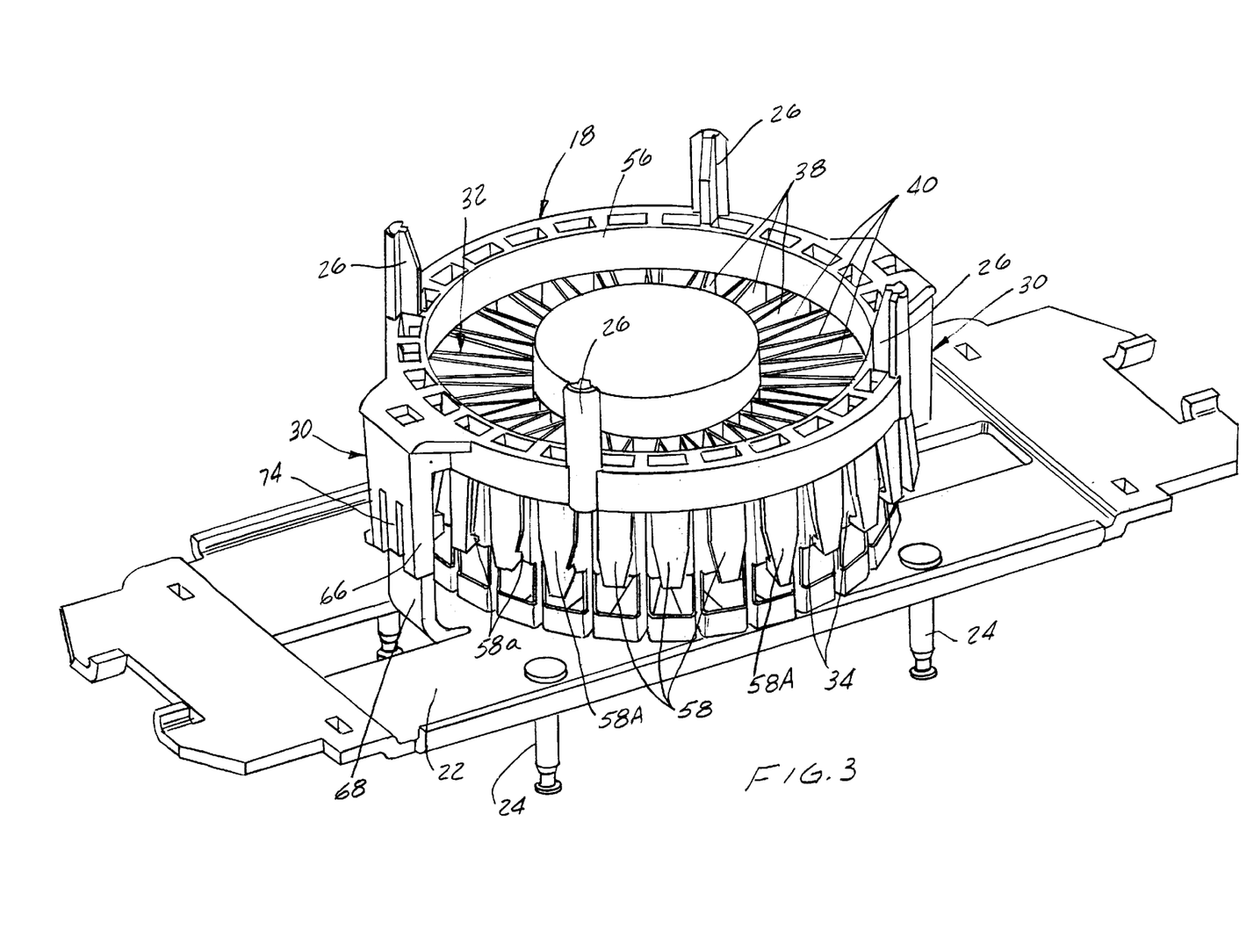
FIG. 3 is a view similar to that of FIG. 1, with the fan assembly removed.

As seen in FIG. 3, four mounting posts 26 project upwardly from retainer 18 for insertion into four mounting holes 28 (FIG. 1) in fan assembly 26, as by a press or interference fit. As will be described in greater detail hereinafter, complementary interengaging latch means, generally designated 30, are provided between retainer 18 and base plate 22 or the heat generating component (not shown) to mount the heat exchanging assembly 10 to the plate 22 or the heat generating component (not shown).

Figure 4:
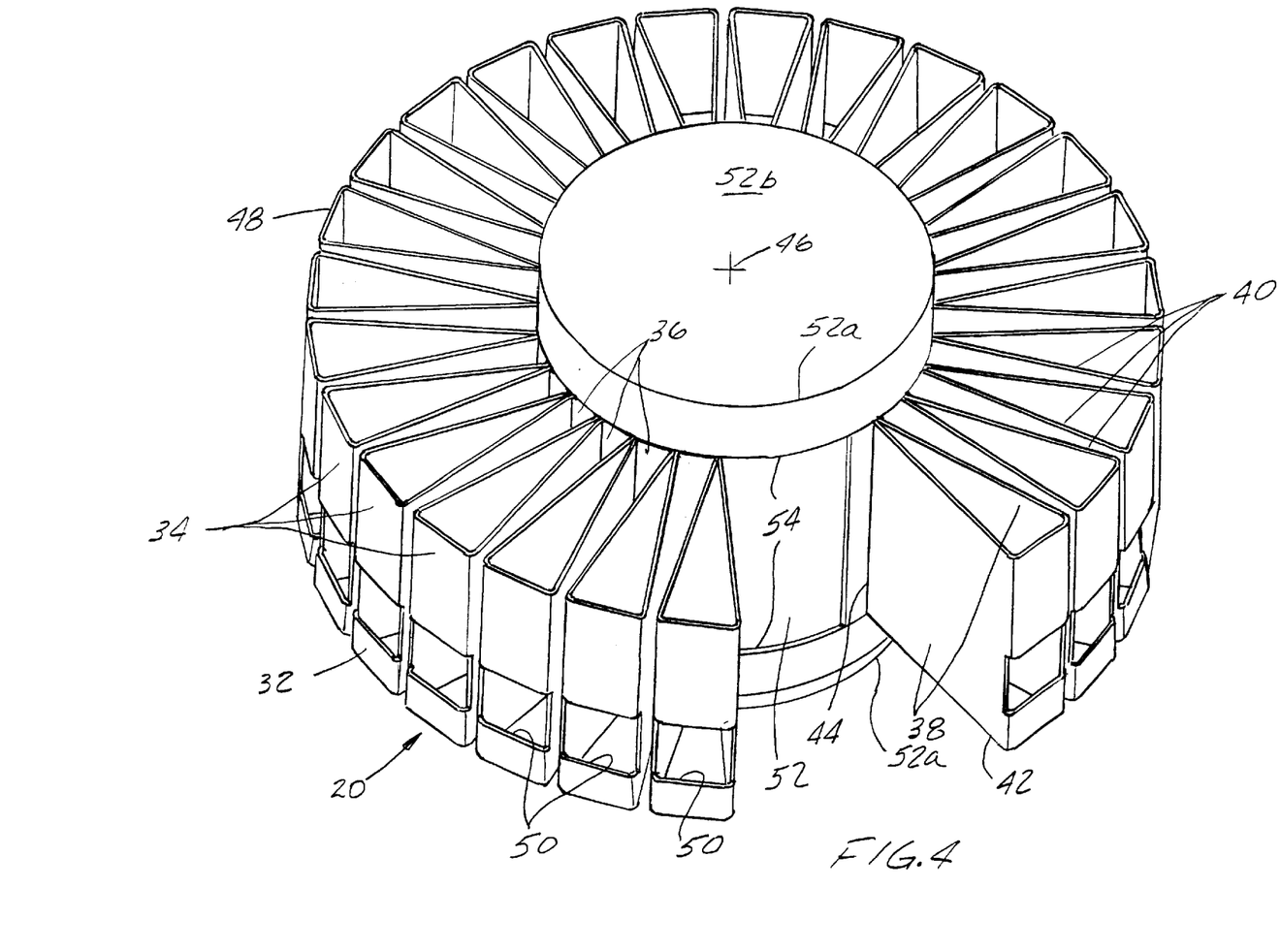
FIG. 4 is a top perspective view of the cylindrically folded sheet, partially cut away to show the thermally conductive core.

Referring to FIG. 4, heat exchanging section 20 includes a thermally conductive sheet, generally designated 32, which is folded into alternating ridges 34 and troughs 36 defining generally parallel spaced fins 38 having opposite top and bottom end edges 40 and 42, respectively. Folded sheet 32 is formed into a generally cylindrical configuration whereby troughs 36 form an inner segmented cylinder 44 defining an axis 46, and ridges 34 form an outer segmented cylinder 48 generally concentric with inner cylinder 44. Ridges 38 radiate generally outwardly of axis 46. The inner and outer cylinders are "segmented" because they are not defined by continuously smooth surfaces, thereby allowing air to circulate to or from the side of fins 38. In other words, ridges 34 and troughs 36 form axially extending circumferentially spaced segments of the cylinders. Ridges 34 also includes apertures 50 that allow for increased air flow through the fins 38 in those instances where end edges 42 of fins 38 are in direct contact with a heat generating component (not shown) or the plate 22, or in those instances where additional air escape paths are desired to meet the required cooling requirements of the system. The apertures also may perform a dual function of latching as described hereinafter.

Still referring to FIG. 4, a thermally conductive core 52 is disposed within inner segmented cylinder 44 defined by troughs 36 of cylindrically folded sheet 32. The core may be a solid structure, a hollow structure or may comprise a fluid filled heat pipe. Whereas the preferred shape of the core 52 is circular, it may be of any configuration, such as semicircular in cross-section (not shown). Finally, as seen in FIG. 4, oppositely facing circular shoulders 54 formed about the periphery of the core position cylindrically folded sheet 32 axially of the core and spaced from opposite ends 52a of the core. The bottom shoulder effectively spaces bottom end edges 42 of fins 38 of cylindrically folded sheet 32 from the base plate 22 or the heat generating component (not shown).

Figure 5:
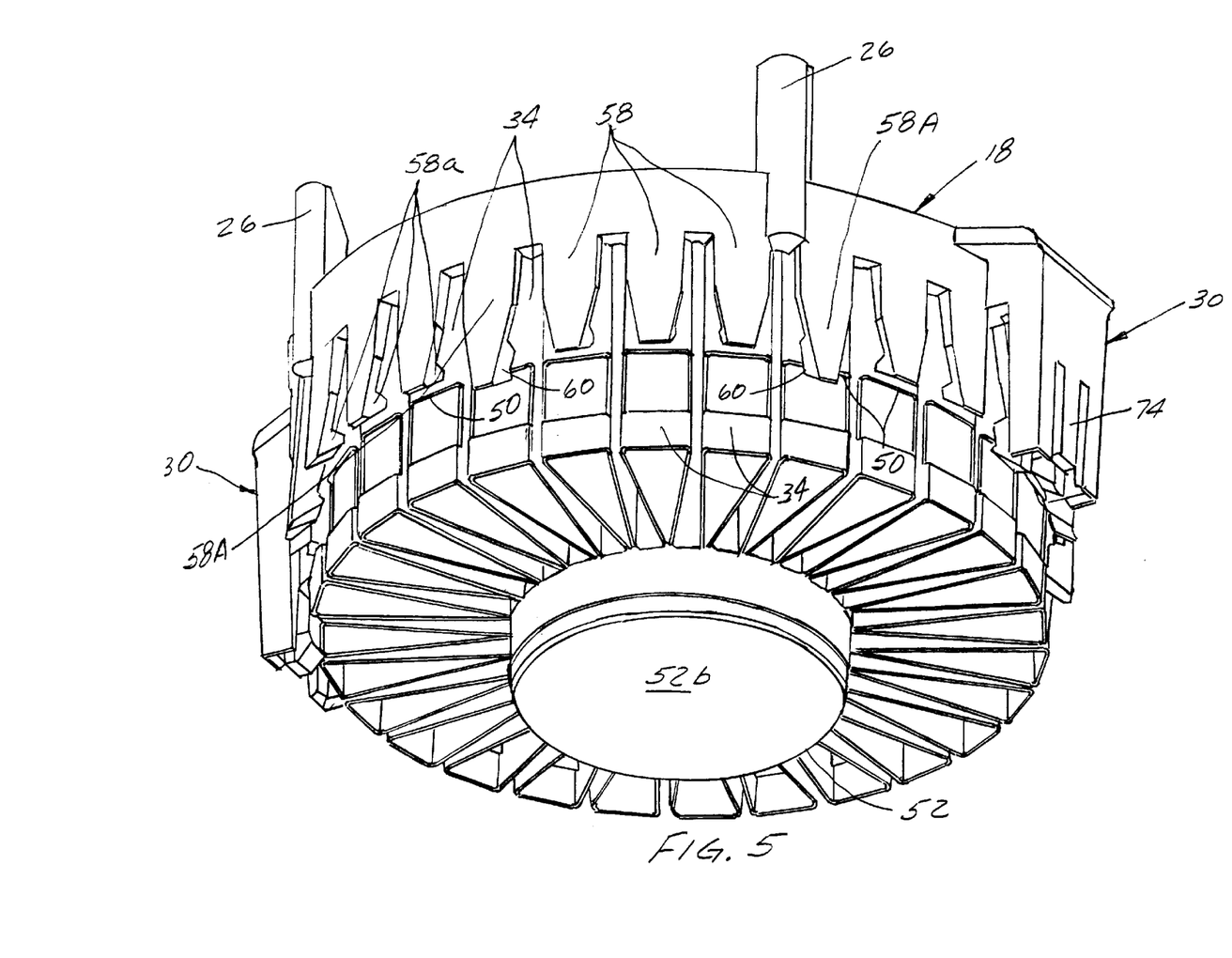
FIG. 5 is a bottom perspective view of the cylindrically folded sheet and core, with the retainer assembly secured thereto.

Referring to FIG. 5 in conjunction with FIG. 3, retainer 18 includes a circular top portion 56 which engages top end edges 40 of fins 38 of cylindrically folded sheet 32 generally about the outer periphery thereof. A plurality of fingers 58 depend from circular top portion 56, and the fingers are individually engageable with ridges 34 of the cylindrically folded sheets. Preferably, retainer 18 is a one-piece structure unitarily molded of plastic material. Therefore, fingers 58 are resilient. The insides of the fingers have projecting hooks 58a for positively engaging ridges 34. Selected ones 58A of the fingers are longer than the remaining fingers 58. The longer fingers 58A have latch detents 60 which engage within apertures 50 in the respective ones of ridges 34. These latch detents are effective to hold retainer 18 down onto the top of the heat exchanging section formed by cylindrically folded sheets 32. In the illustrated embodiment, every fourth finger 58A circumferentially about retainer 18 has a latch detent 60 snap-fit into an aperture 50 in a respective one of ridges 34 thereby preventing relative rotation between the retainer 18 and the cylindrical folded sheet 32. Alternatively, the longer fingers 58A may snap fit its respective latch detent 60 to the bottom end of fin 42 (not shown). Longer fingers 58A may also be used to latch the heat sink assembly 10 to the plate 22 (not shown) or directly to a heat generating component (not shown).

Figure 6:
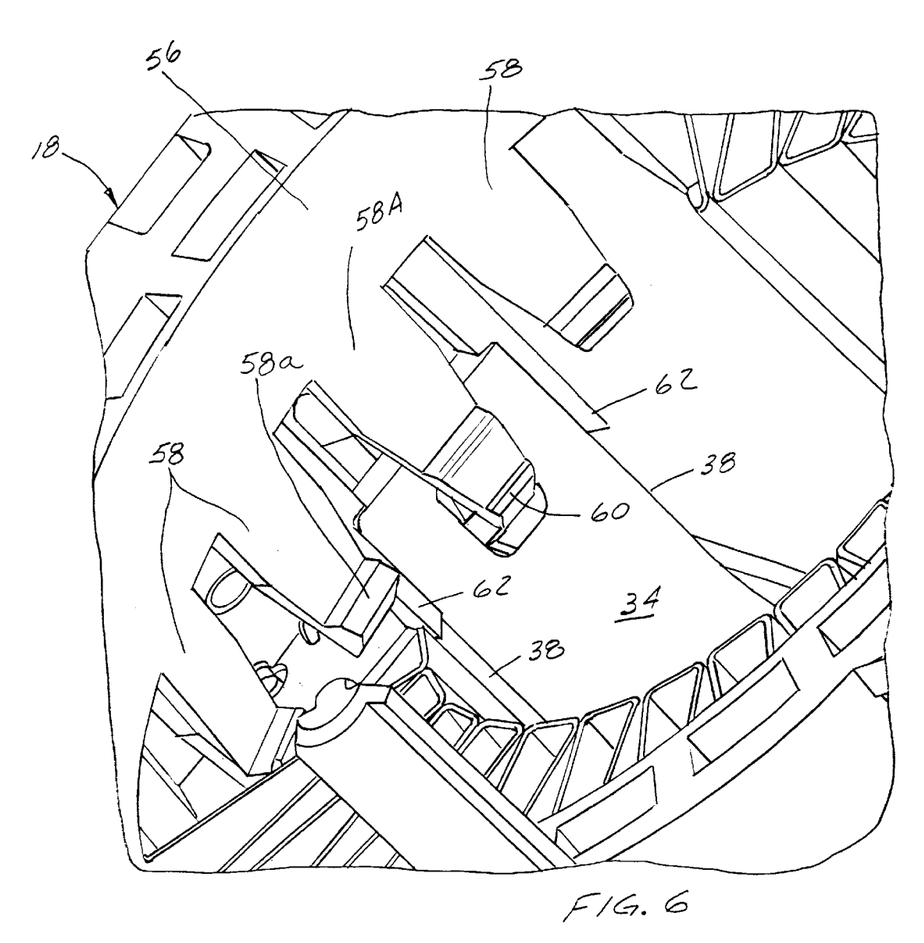
FIG. 6 is a fragmented perspective view showing a pair of the stop projections of the retainer.

FIG. 6 shows a feature of the invention wherein a pair of stop projections 62 depend from circular top portion 56 of retainer 18. More than one pair of the stop projections 62 may be provided about the circumference of circular top portion 56. These stop projections are effective in spacing the bottom end edges 42 of fins 38 of cylindrically folded sheet 32 from base plate 22 or a heat generating component (not shown) and to prevent relative rotation between the retainer and the cylindrically folded sheet.

Figure 7:
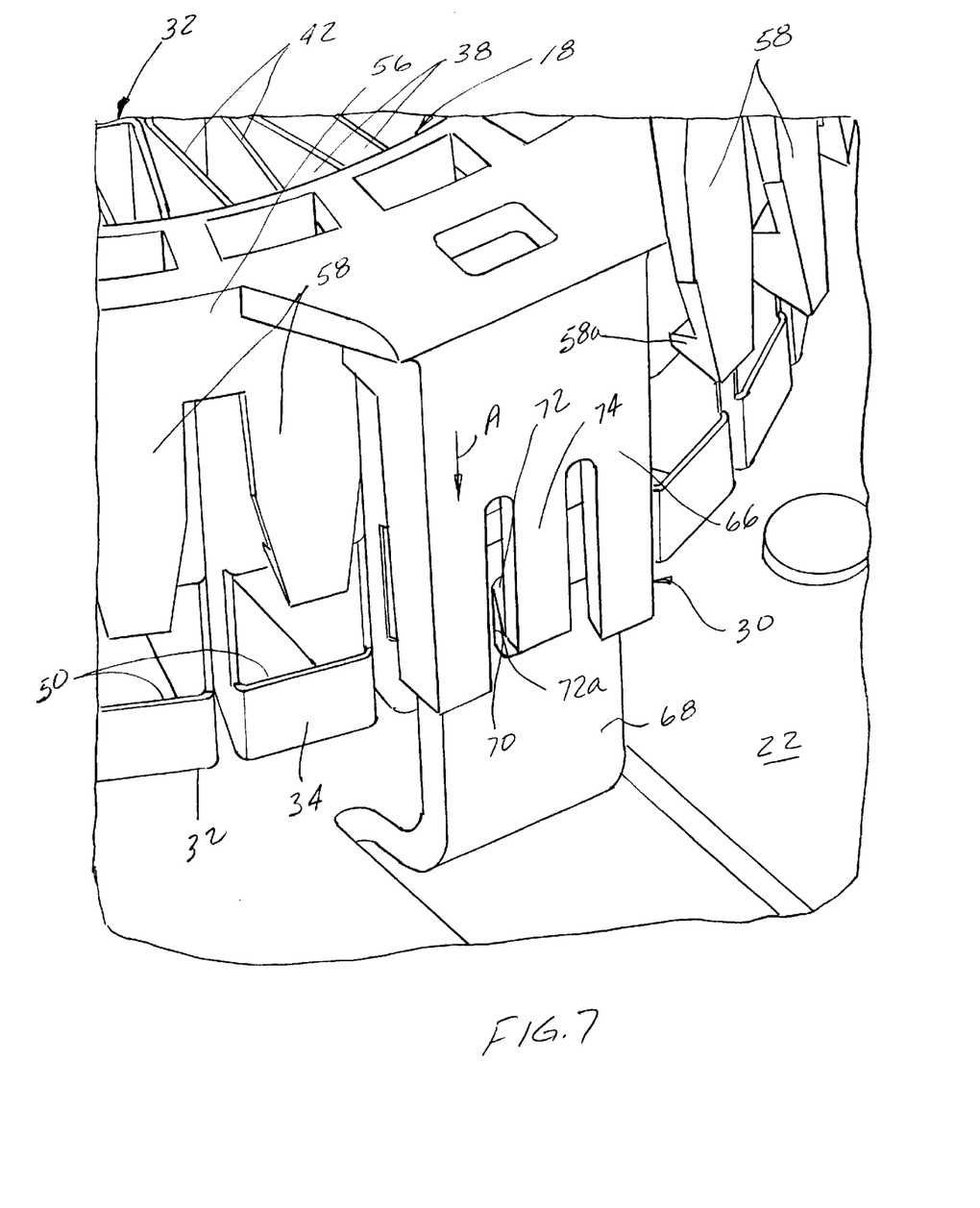
FIG. 7 is a fragmented perspective view showing the complementary interengaging latch means between the retainer and the base plate.

FIG. 7 shows in greater detail one of the complementary interengaging latch means 30 between retainer 18 and base plate 22. Specifically, the latch means include a latch arm 66 depending from circular top portion 56 of retainer 18, and a latch flange 68 projecting upwardly from base plate 22. The base plate may be fabricated of sheet metal material, and flange 68 simply is stamped and formed out of the sheet metal material and bent upwardly as seen in FIG. 7. Latch flange 68 has a latch opening 70 for receiving a latch hook 72 projecting inwardly from a resilient finger 74 formed out of latch arm 66. Latch hook 72 is chamfered, as at 72a, so that when retainer 18 is mounted on top of cylindrically folded sheet 32 in the direction of arrow "A", latch hook 72 resiliently snaps into latch opening 70 to sandwich the cylindrically folded sheet between retainer 18 and base plate 22. Actually, with the cylindrically folded sheet being mounted about core 52 as described above in relation to FIG. 4, retainer 18 will maintain a bottom surface 52b (FIG. 5) of the core in engagement with the base plate or a heat producing electronic device mounted on top of the base plate. As seen in FIG. 1, two of the complementary interengaging latch means 30 as described in relation to FIG. 7 are diametrically disposed on opposite sides of heat exchanger assembly 10. Alternatively, the heat sink assembly 10 may be maintained on the plate 22 by the bottom surface 52b of the core (FIG. 2), such as by the bottom surface of the core 52b being threaded into a threaded aperture in plate 22 (not shown), by an interference fit between the bottom surface of the core 52b and an aperture in plate 22 or by any other way known in the art. Additionally, the latch hook 72 may directly engage an aperture in the plate 22 (not shown) or directly engage a heat generating component (not shown).

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A heat sink assembly, comprising:
    a heat exchanging section including a thermally conductive sheet folded into alternating ridges and troughs defining spaced fins having first and second end edges, said folded sheet being formed into a generally cylindrical configuration defining an axis and whereby the troughs form an inner segmented cylinder, the ridges form an outer segmented cylinder generally concentric with the inner cylinder and the fins radiate generally outwardly from said axis;
    a thermally conductive core within said inner segmented cylinder defined by the troughs of the cylindrically folded sheet; and
    a retainer in engagement with the cylindrically folded sheet, said retainer including a plurality of depending fingers individually engageable with at least some of the ridges of the cylindrically folded sheet.

2. The heat sink assembly of claim 1 wherein said retainer includes a circular top portion for engaging the cylindrically folded sheet at said second end edges of the fins.

3. The heat sink assembly of claim 1 wherein at least some of said ridges include apertures for receiving latch detents on the insides of respective ones of said fingers.

4. The heat sink assembly of claim 1 including a complementary interengaging latch means between the retainer and a heat generating component.

5. The heat sink assembly of claim 4 wherein said complementary interengaging latch means include a latch arm depending from the retainer.

6. The heat sink assembly of claim 5 wherein said complementary interengaging latch means include a latch flange projecting upwardly from said heat generating component.

7. The heat sink assembly of claim 1, wherein said retainer includes a fan mounted thereon.

8. A heat sink assembly, comprising:
   a heat exchanging section including a thermally conductive sheet folded into alternating ridges and troughs defining spaced fins having first and second end edges, said folded sheet being formed into a generally cylindrical configuration defining an axis and whereby the troughs form an inner segmented cylinder, the ridges form an outer segmented cylinder generally concentric with the inner cylinder and the fins generally radiate outwardly from said axis;
   a thermally conductive core within said inner segmented cylinder defined by the troughs of the cylindrically folded sheet;
   a retainer in engagement with the cylindrically folded sheet;
   a base plate above which the heat exchanging section is mounted, with the first end edges of the fins of the cylindrically folded sheet being between the base plate and the second end edges of the fins; and
   complementary interenging latch means between the retainer and the base plate to hold the heat exchanging section therebetween.

9. The heat sink assembly of claim 8 wherein said retainer includes a circular top portion for engaging the cylindrically folded sheet at said second end edges of the fins and a plurality of depending fingers engageable with at least some of the ridges of the cylindrically folded sheet.

10. The heat sink assembly of claim 9 wherein at least some of said ridges include apertures for receiving latch detents on the insides of respective ones of said fingers.

11. The heat sink assembly of claim 9 wherein said fingers depend from a peripheral edge of the circular top portion.

12. The heat sink assembly of claim 8 wherein said complementary interengaging latch means includes a latch arm depending from the retainer.

13. The heat sink assembly of claim 12 wherein said complementary interengaging latch means include a latch flange projecting upwardly from the base plate.

14. The heat sink assembly of claim 13 wherein said complementary interengaging latch means include a resilient latch hook on one of said latch arm and latch flange snappingly engaged in a latch opening in the other of said latch arm and latch flange.

15. The heat sink assembly of claim 8 wherein said core includes means for raising the heat exchanging section off the base plate so that the first end edges of the fins of the cylindrically folded sheet are spaced from the base plate.

16. A heat sink assembly, comprising:
   a heat exchanging section including a thermally conductive sheet folded into alternating ridges and troughs defining spaced fins having first and second end edges, said folded sheet being formed into a generally cylindrical configuration defining an axis and whereby the troughs form an inner segmented cylinder, the ridges form an outer segmented cylinder generally concentric with the inner cylinder and the fins radiate generally outwardly from said axis; and
   a retainer including a circular top portion engageable with the cylindrically folded sheet generally at said second end edges of the fins.

17. The heat sink assembly of claim 16 including a plurality of fingers depending from the circular top portion of said retainer, said fingers engageable with at least some of the ridges of the cylindrically folded sheet.

18. A heat sink assembly, comprising:
   a thermally conductive core; and
   a heat exchanging section including a thermally conductive sheet folded into alternating ridges and troughs defining spaced fins, said troughs being in contact with said core.

19. The heat sink assembly of claim 18 wherein said core is semicircular in cross-section.

20. The heat sink assembly of claim 18 wherein said core is solid.

21. The heat sink assembly of claim 18 wherein said core is hollow.

22. The heat sink assembly of claim 18 wherein said core comprises a fluid filled heat pipe.

23. A heat sink assembly, comprising:
   a heat exchanging section including a thermally conductive sheet folded into alternating ridges and troughs defining spaced fins having first and second end edges, said folded sheet being formed into a generally cylindrical configuration defining an axis and whereby the troughs form an inner segmented cylinder, the ridges form an outer segmented cylinder generally concentric with the inner cylinder and the fins radiate generally outwardly from said axis;
   a thermally conductive core within said inner segmented cylinder defined by the troughs of the cylindrically folded sheet; and
   a retainer in direct engagement with the cylindrically folded sheet, said retainer including a fan mounted thereon.

* * * * *

UNITED STATES PATENT AND TRADEMARK OFFICE
CERTIFICATE OF CORRECTION

PATENT NO. : 6,557,626 B1
DATED : May 6, 2003
INVENTOR(S) : Michael O'Sullivan et al.

It is certified that error appears in the above-identified patent and that said Letters Patent is hereby corrected as shown below:

<u>Title page,</u>
Item [75], Inventors, should read:
-- [75] Inventors: Michael O'Sullivan, Willowbrook, IL (US); Kent E. Regnier, Lombard, IL (US); William C. Bamford, Clarendon Hills, IL (US); Daniel S. Price, Naperville, IL (US); Gregory T. Wyler, Manchester, MA (US); Kenneth T. Stead, Aurora, IL (US); Blaine C. Wotring, Derry, NH (US) --

Signed and Sealed this

Thirtieth Day of March, 2004

JON W. DUDAS
*Acting Director of the United States Patent and Trademark Office*